(12) United States Patent
Giardina et al.

(10) Patent No.: US 10,431,447 B2
(45) Date of Patent: Oct. 1, 2019

(54) POLYSILICON CHIP RECLAMATION ASSEMBLY AND METHOD OF RECLAIMING POLYSILICON CHIPS FROM A POLYSILICON CLEANING APPARATUS

(71) Applicant: Hemlock Semiconductor Corporation, Hemlock, MI (US)

(72) Inventors: Jason L. Giardina, Freeland, MI (US); James C. Mundell, Saginaw, MI (US); Nathaniel C. McIntee-Chmielewski, Freeland, MI (US)

(73) Assignee: HEMLOCK SEMICONDUCTOR CORPORATION, Hemlock, MI (US)

( * ) Notice: Subject to any disclaimer, the term of this patent is extended or adjusted under 35 U.S.C. 154(b) by 182 days.

(21) Appl. No.: 15/506,483

(22) PCT Filed: Sep. 3, 2015

(86) PCT No.: PCT/US2015/048293
§ 371 (c)(1),
(2) Date: Feb. 24, 2017

(87) PCT Pub. No.: WO2016/053571
PCT Pub. Date: Apr. 7, 2016

(65) Prior Publication Data
US 2018/0226243 A1    Aug. 9, 2018

Related U.S. Application Data

(60) Provisional application No. 62/057,568, filed on Sep. 30, 2014.

(51) Int. Cl.
*H01L 21/02* (2006.01)
*H01L 23/48* (2006.01)
(Continued)

(52) U.S. Cl.
CPC .......... *H01L 21/02079* (2013.01); *B08B 3/08* (2013.01); *B08B 3/14* (2013.01);
(Continued)

(58) Field of Classification Search
CPC ......... H01L 21/02079; H01L 21/67028; H01L 21/67051; H01L 21/67057;
(Continued)

(56) References Cited

U.S. PATENT DOCUMENTS 5,799,643 A * 9/1998 Miyata .................. B28D 1/025
125/21
6,006,736 A * 12/1999 Suzuki ...................... B08B 3/02
125/13.02
(Continued)

FOREIGN PATENT DOCUMENTS

JP    2001106595 A    4/2001
JP    2002001244 A    1/2002
(Continued)

OTHER PUBLICATIONS

International Search Report and Written Opinion regarding related PCT App. No. PCT/US2015/048293; dated Nov. 30, 2015; 8 pgs.
(Continued)

*Primary Examiner* — David G Cormier
(74) *Attorney, Agent, or Firm* — Cantor Colburn LLP

(57) ABSTRACT

A polysilicon chip reclamation assembly includes a polysilicon cleaning apparatus configured to clean a plurality of bodies of polysilicon. Also included is a plurality of polysilicon chips generated from the bodies of polysilicon during cleaning thereof, wherein each of the plurality of polysilicon chips has a longest dimensional length ranging from 0.1 mm to 25.0 mm. Further included is a polysilicon apparatus drain line configured to route the plurality of polysilicon chips from the polysilicon cleaning apparatus to a main chip drain
(Continued)

line, wherein the main chip drain line is oriented at a downward slope away from the polysilicon apparatus drain line. Yet further included is a fluid source fluidly coupled to the main chip drain line and configured to inject a fluid into the main chip drain line to drive the plurality of polysilicon chips through the main chip drain line.

14 Claims, 1 Drawing Sheet

(51) Int. Cl.
*H01L 21/67* (2006.01)
*H01L 21/677* (2006.01)
*B08B 3/08* (2006.01)
*B08B 3/14* (2006.01)
*C30B 29/06* (2006.01)
*C30B 35/00* (2006.01)

(52) U.S. Cl.
CPC ............ *C30B 29/06* (2013.01); *C30B 35/007* (2013.01); *H01L 21/67028* (2013.01); *H01L 21/67051* (2013.01); *H01L 21/67721* (2013.01); *H01L 21/67784* (2013.01); *H01L 23/48* (2013.01); *H01L 2924/0002* (2013.01)

(58) Field of Classification Search
CPC ......... H01L 21/67092; H01L 21/67155; H01L 21/67161; H01L 21/67173; H01L 21/67721; B08B 3/00; B08B 3/04; B08B 3/041; B08B 3/08; B08B 3/102; B08B 3/12; B08B 3/123; B08B 3/14; B08B 15/04; B23Q 11/0042; B23Q 11/0053; B23Q 11/0057; B23Q 11/0067; B23Q 11/0075; C30B 35/00; C30B 35/005; C30B 35/007; B24B 55/12; B28D 5/007; B28D 5/0076; B28D 5/0082; B28D 5/0088; B01D 21/24; B01D 21/2405; B01D 21/2455
See application file for complete search history.

(56) References Cited

U.S. PATENT DOCUMENTS

| | | | |
|---|---|---|---|
| 6,119,365 A * | 9/2000 | Wuller | B08B 3/02 |
| | | | 34/218 |
| 6,375,841 B1 * | 4/2002 | Nemedi | B04B 3/00 |
| | | | 209/12.1 |
| 2002/0023670 A1 | 2/2002 | Shiramizu et al. | |
| 2003/0172963 A1 | 9/2003 | Sugimoto | |
| 2005/0269254 A1 | 12/2005 | Roitman | |
| 2012/0131814 A1 | 5/2012 | Gibbel | |

FOREIGN PATENT DOCUMENTS

| | | |
|---|---|---|
| JP | 2011071275 A | 4/2011 |
| KR | 100874383 B1 | 12/2008 |
| KR | 20090026266 A | 3/2009 |

OTHER PUBLICATIONS

Japanese Office Action for the corresponding JP Application No. 2017-516997; dated Jun. 3, 2019. 4 pages (translation).

* cited by examiner

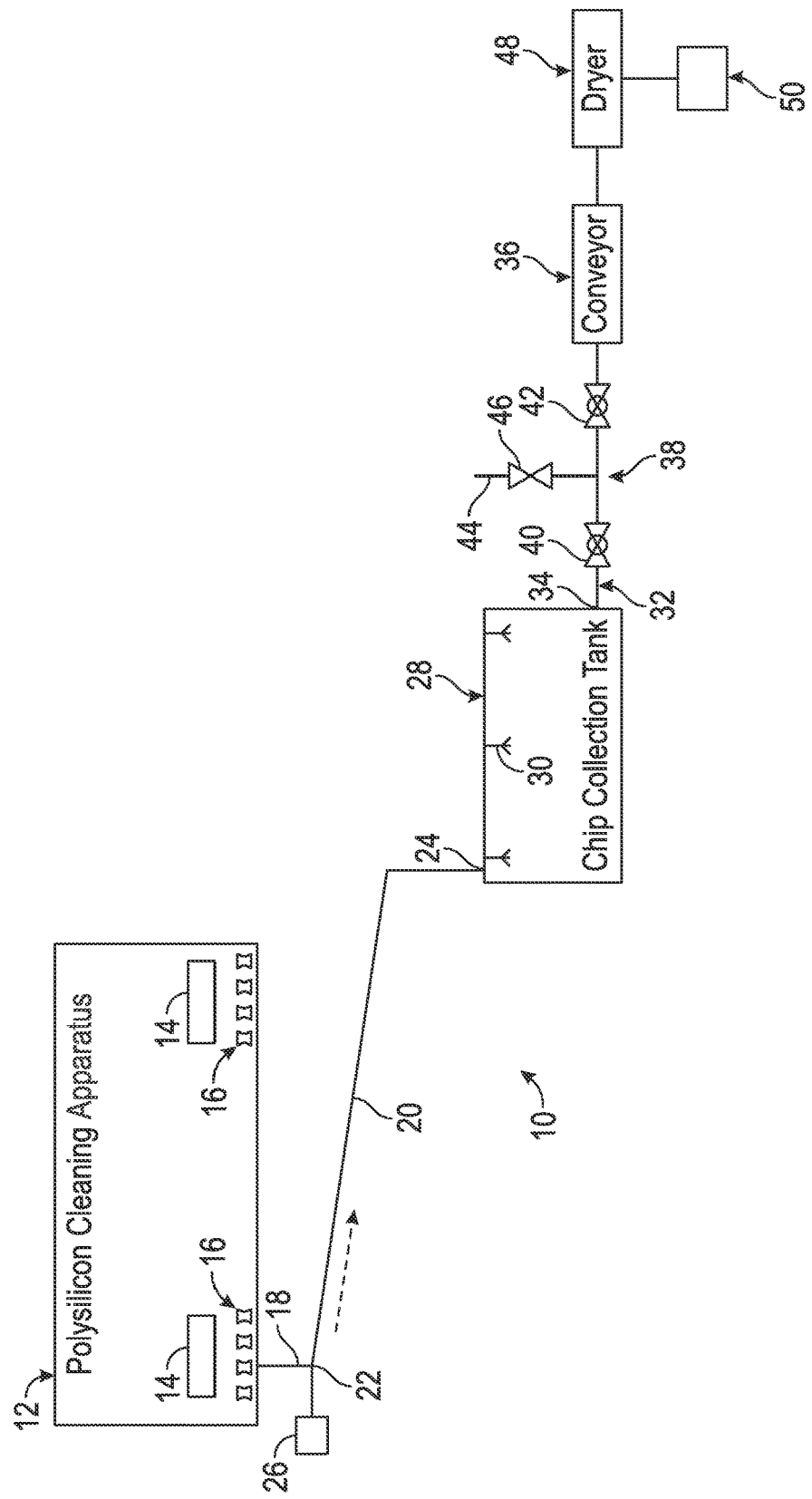

POLYSILICON CHIP RECLAMATION ASSEMBLY AND METHOD OF RECLAIMING POLYSILICON CHIPS FROM A POLYSILICON CLEANING APPARATUS

CROSS REFERENCE TO RELATED APPLICATIONS

This application is a National Phase Application of Patent Application PCT/US2015/048293, filed on Sep. 3, 2015, which claims priority to U.S. Provisional Patent Application No. 62/057,568, filed Sep. 30, 2014, the disclosures of which are incorporated herein by reference in their entireties.

TECHNICAL FIELD

Disclosed herein is a polysilicon chip reclamation assembly and a method of reclaiming polysilicon chips from a polysilicon cleaning apparatus.

BACKGROUND

Electronic components such as rectifiers, transistors, photo transistors, computer chips, and the like require extremely high purity monocrystalline silicon. In commercial processes this monocrystalline silicon is prepared by first forming polycrystalline silicon (also referred to herein as polysilicon) ingots by chemical vapor deposition of silanes onto a heated silicon element. These polycrystalline silicon ingots are then converted into monocrystalline silicon by various methods.

During the overall process, the polycrystalline silicon bodies are cleaned to reduce contaminates that the bodies are subjected to during the overall process. One manner of cleaning includes placing the polycrystalline silicon bodies within a wash bench chamber that is configured to place the polycrystalline silicon bodies in contact with an acid or other fluid well-suited to clean the bodies. During such a process, polysilicon chips are produced. The polysilicon chips are valuable in the aggregate and various attempts have been made to recapture the smaller chips that settle at the bottom of the wash bench chamber. Such efforts have been made manually by scooping the chips or with the use of a vacuum or the like to reclaim the chips.

The above-noted manual chip reclamation processes inherently lead to a less than optimal yield, as some chips cannot be reclaimed in this manner. The processes also require maintenance personnel, which increases cost and poses safety issues that must be addressed. Furthermore, as with any manual process, certain contaminating effects must be considered.

SUMMARY

In one exemplary embodiment of the invention, a polysilicon chip reclamation assembly includes a polysilicon cleaning apparatus configured to clean a plurality of bodies of polysilicon. Also included is a plurality of polysilicon chips generated from the bodies of polysilicon during cleaning thereof, wherein each of the plurality of polysilicon chips has a longest dimensional length ranging from 0.1 mm to 25.0 mm. Further included is a polysilicon apparatus drain line configured to route the plurality of polysilicon chips from the polysilicon cleaning apparatus to a main chip drain line, wherein the main chip drain line is oriented at a downward slope away from the polysilicon apparatus drain line. Yet further included is a fluid source fluidly coupled to the main chip drain line and configured to inject a fluid into the main chip drain line to drive the plurality of polysilicon chips through the main chip drain line.

In another exemplary embodiment of the invention, a method of reclaiming polysilicon chips from a polysilicon cleaning apparatus is provided. The method includes flushing a plurality of polysilicon chips from a polysilicon cleaning apparatus through at least one polysilicon apparatus drain line, wherein each of the plurality of polysilicon chips has a longest dimensional length ranging from 0.1 mm to 25.0 mm. The method also includes routing the plurality of polysilicon chips through the polysilicon apparatus drain line to a main chip drain line that is oriented at a downward slope. The method further includes driving the plurality of polysilicon chips through the main chip drain line with a fluid to a chip collection tank.

DETAILED DESCRIPTION

Referring to FIG. 1, a polysilicon chip reclamation assembly 10 is schematically illustrated. The polysilicon chip reclamation assembly 10 is generally employed to collect, route and package polysilicon chips that have been subjected to a cleaning process within a polysilicon cleaning apparatus 12. The polysilicon cleaning apparatus 12 refers to any chamber that is configured to enclose at least one, but typically a plurality of bodies of polysilicon 14 to be cleaned with a fluid, such as hydrochloric acid, for example.

During the cleaning process of the polysilicon bodies 14 within the polysilicon cleaning apparatus 12, a plurality of polysilicon chips 16 are produced. The polysilicon chips 16 are relatively fine particles that have a longest dimensional length ranging from about 0.1 mm to about 25.0 mm. The polysilicon chips 16 typically congregate at the bottom of the polysilicon cleaning apparatus 12 due to the rinsing of the larger polysilicon bodies 14 with the cleaning fluid and flushing of the polysilicon cleaning apparatus 12. The embodiments of the polysilicon chip reclamation assembly 10 disclosed herein relate to an automated system and method that facilitate recapturing the polysilicon chips 16. The automated system and method provides numerous advantages over a manual chip reclamation process. Specifically, avoiding the use of maintenance personnel to collect the polysilicon chips 16 at the bottom of the polysilicon cleaning apparatus 12 reduces issues with safety, downtime, and cost associated with the personnel. Furthermore, a higher yield of polysilicon product is achieved with the automated system and method, while reducing contamination that is inherently present with several manual methods, including simply vacuuming the polysilicon chips 16.

As noted above, during the cleaning process, the polysilicon chips 16 gravitate toward the bottom of the polysilicon cleaning apparatus 12. Proximate the bottom of the polysilicon cleaning apparatus 12 is at least one polysilicon apparatus drain line 18 configured to route the polysilicon chips 16 from the polysilicon cleaning apparatus 12 to a main chip drain line 20. In some embodiments, a plurality of polysilicon apparatus drain lines are included and may route the polysilicon chips to a single main chip drain line or a plurality of main chip drain lines. For purposes of this description, a single polysilicon apparatus drain line and a single main chip drain line are discussed.

The polysilicon apparatus drain line 18 may be formed of any geometric configuration and is positioned to flush the polysilicon chips 16 into the main chip drain line 20. A fluid may be employed within or upstream of the polysilicon apparatus drain line 18 to encourage a more thorough flushing of the polysilicon chips 16, however, this may not be required due to the wet nature of the cleaning process within the polysilicon cleaning apparatus 12.

The main chip drain line 20 is a structure that is open on both ends and includes an enclosed interior portion therebetween. Any suitable geometric cross-section may be employed, but irrespective of the particular shape of the main chip drain line 20, the main chip drain line 20 is oriented at a downward angle, thereby sloping away from the polysilicon cleaning apparatus 12 and the polysilicon apparatus drain line 18. Specifically, the outlet of the polysilicon apparatus drain line 18 which outputs the polysilicon chips 16 to the main chip drain line 20 proximate a first end 22 of the main chip drain line 20 is located at a first height. The main chip drain line 20 is oriented to route the polysilicon chips 16 to a second end 24 of the main chip drain line 20, with the second end 24 being disposed at a height lower than the first height. Therefore, the main chip drain line 20 routes the polysilicon chips 16 from an elevated location to a lower location. In some embodiments, the main chip drain line 20 routes the polysilicon chips 16 through one or more floors of a building structure. At least a portion of the main chip drain line 20 is linearly disposed and downwardly sloped at a rate of about 0.5 inches/foot to about 1.5 inches/foot. It one embodiment, the entire length of the main chip drain line 20 is linear. In other embodiments, only a portion of the main chip drain line 20 is linear. As noted above, the main chip drain line 20 may be formed of any suitable cross-sectional shape. In one embodiment, the main chip drain line 20 is a cylinder (e.g., tube) having a circular cross-section having a diameter ranging from about 3 inches to about 8 inches. In one embodiment, the diameter is about 6 inches. Any suitable material may be used to form the main chip drain line 20. One exemplary embodiment comprises plastic.

To facilitate continuous movement of the polysilicon chips 16 within the main chip drain line 20, a fluid source 26 is fluidly coupled to the main chip drain line 20 and configured to inject a fluid into the interior portion of the main chip drain line 20 to drive the polysilicon chips 16 therethrough. In one embodiment, the fluid comprises deionized water. The fluid is provided to the main chip drain line 20 at a volumetric flow rate ranging from about 10 gallons/minute to about 20 gallons per minute. This flow rate, combined with the precise above-specified slope range of the main chip drain line 20, ensures that the polysilicon chips 16 will not become immobilized at any location within the main chip drain line 20.

Proximate the second end 24 of the main chip drain line 20 is a chip collection tank 28. The chip collection tank 28 is positioned to receive the polysilicon chips 16 that are routed through and out of the main chip drain line 20. Specifically, the outlet of the main chip drain line 20 at the second end 24 is configured to direct the polysilicon chips 16 into the chip collection tank 28. The chip collection tank 28 includes a rinsing system 30 that dispenses a rinsing fluid into contact with the polysilicon chips 16 disposed therein. As described above, the polysilicon chips 16 are exposed to a cleaning fluid, such as hydrochloric acid, in the polysilicon cleaning apparatus 12. This process results in an acidic pH level of the polysilicon chips 16. The rinsing fluid dispensed from the rinsing system 30 neutralizes the pH level of the polysilicon chips 16.

After completion of collection and neutralization of the polysilicon chips 16 within the chip collection tank 28, the polysilicon chips 16 are routed out of the chip collection tank 28 through a chip routing line 32. The chip routing line 32 extends from an outlet 34 of the chip collection tank 28 to a conveyor 36. Along the chip routing line 32, a valve assembly 38 is present to regulate the flow of the polysilicon chips 16, as well as fluid (e.g., fluid from fluid source 26 and/or rinsing fluid) urging the polysilicon chips 16 through the chip routing line 32. The valve assembly 38 includes a plurality of valves, such as a first valve 40 and a second valve 42. Situated along the chip routing line 32 between the first valve 40 and the second valve 42 is a purge line 44 fluidly coupled to the chip routing line 32. The purge line 44 includes a purge valve 46 therein that regulates the flow of a purge fluid, such as water, for example. Although the embodiment illustrated and described above includes two valves, it is to be appreciated that any number of a plurality of valves may be included in the valve assembly 38 and that the purge line 44 is fluidly coupled to the chip routing line 32 at any location that is between any two of the plurality of valves, such that at least one valve is located upstream of the fluid coupling of the purge line 44 to the chip routing line 32 and at least one valve is located downstream of such fluid coupling.

The chip collection tank 28 is filled to a level of 15-30% with water while the polysilicon chips 16 are in the chip collection tank 28. The first valve 40 and the second valve 42 open simultaneously and a chip/water slurry drains through the chip routing line 32 in conveyor 36. After a first delay, the nozzles of the rinsing system 30 open and spray water into the chip collection tank 28 to flush remaining chips out of the chip collection tank 28 through the chip routing line 32. After second delay, the nozzles of the rinsing system 30 stop spraying water. After a third delay, the first valve 40 closes, then the purge valve 46 opens and flushes water through the purge line 44 and through the second valve 42 and subsequently into the conveyor 36. After a fourth delay, the purge valve 46 is closed, then valve 42 is closed. The above-described process facilitates routing of a maximum number of the polysilicon chips 16 out of the chip collection tank 28 and reduces the likelihood of clogging or damage within the valve assembly 38.

As described above, once the polysilicon chips 16 pass through the chip routing line 32 and the valve assembly 38 therealong, the polysilicon chips 16 are routed onto the conveyor 36. The conveyor 36 is configured to de-water the polysilicon chips 16 during operation. In one embodiment, at least a portion of the conveyor 36 itself is a vibratory conveyor. In another embodiment, the conveyor 36 is simply a screen that allows fluid to pass therethrough. The conveyor 36 may be oriented at an upward angle. In one embodiment, the angle ranges from about 5 degrees to about 10 degrees. The de-watering system associated with the conveyor 36 is configured to remove up to about 95% of the fluid. In an exemplary embodiment, the de-watering system removes about 75% to about 95% of the fluid. The conveyor 36 routes the polysilicon chips 16 to a vibratory conveyor, which may simply be a portion of the conveyor 36 or a separate component or assembly, for further de-watering of the polysilicon chips 16.

The polysilicon chips 16 are then routed to a dryer 48 from the conveyor 36. The dryer 48 includes a heated interior chamber configured to heat the polysilicon chips 16 and dehumidify the chips therein. To ensure heating and dehumidification of the polysilicon chips 16 to a desired level, at least one temperature sensor and at least one moisture sensor are disposed within the dryer 48. The sensors monitor the temperature and humidity level within the dryer 48. The dryer 48 remains in operation until the sensors sufficiently detect temperature and humidity levels that fall within the predetermined desired levels. In one embodiment, the dryer 48 operates until detection of a predetermined temperature that ranges from about 115 degrees Fahrenheit to about 220 degrees Fahrenheit. Additionally, operation may continue until detection of a predetermined humidity level of about 5% to about 25%. Upon detection of the predetermined parameters, the dryer dispenses the polysilicon chips 16 to a packaging unit 50. In one embodiment, the packaging unit 50 is placed on a scale that alerts an operator when a predetermined weight is attained.

Advantageously, the embodiments of the polysilicon chip reclamation assembly 10 and methods described herein have a positive effect on yield, safety, on-line time of the overall system, profit, while reducing contamination.

The methods disclosed herein include at least the following embodiments:

Embodiment 1

A polysilicon chip reclamation assembly includes a polysilicon cleaning apparatus configured to clean a plurality of bodies of polysilicon. Also included is a plurality of polysilicon chips generated from the bodies of polysilicon during cleaning thereof, wherein each of the plurality of polysilicon chips has a longest dimensional length ranging from 0.1 mm to 25.0 mm. Further included is a polysilicon apparatus drain line configured to route the plurality of polysilicon chips from the polysilicon cleaning apparatus to a main chip drain line, wherein the main chip drain line is oriented at a downward slope away from the polysilicon apparatus drain line. Yet further included is a fluid source fluidly coupled to the main chip drain line and configured to inject a fluid into the main chip drain line to drive the plurality of polysilicon chips through the main chip drain line.

Embodiment 2

The system of Embodiment 1, wherein the fluid comprises deionized water.

Embodiment 3

The system of Embodiment 1-2, wherein the fluid is routed through into the main chip drain line at a flow rate from 10 gallons/minute to 20 gallons/minute.

Embodiment 4

The system of Embodiment 1-3, wherein the downward slope of the main chip drain line is from 0.5 inches/foot to 1.5 inches/foot.

Embodiment 5

The system of Embodiment 1-4, further comprising a plurality of polysilicon apparatus drain lines extending between the polysilicon cleaning apparatus to the main chip drain line.

Embodiment 6

The system of Embodiment 1-5, wherein the main chip drain line comprises a plastic tube.

Embodiment 7

The system of Embodiment 1-6, wherein the plastic tube comprises a diameter of from 3 inches to 8 inches.

Embodiment 8

The system of Embodiment 1-7, further comprising a chip collection tank, wherein the main chip drain line comprises an outlet proximate the chip collection tank, the outlet configured to direct the plurality of polysilicon chips into the chip collection tank.

Embodiment 9

The system of Embodiment 1-8, wherein the chip collection tank comprises a rinsing system configured to dispense a rinsing fluid into contact with the plurality of polysilicon chips to neutralize a pH level of the plurality of chips.

Embodiment 10

The system of Embodiment 1-9, wherein the chip collection tank comprises an evacuation drain line configured to route the rinsing fluid out of the chip collection tank.

Embodiment 11

The system of Embodiment 1-10, further comprising a chip routing line extending between an outlet of the chip collection tank and a conveyor.

Embodiment 12

The system of Embodiment 1-11, wherein the conveyor comprises a vibratory conveyor.

Embodiment 13

The system of Embodiment 1-12, wherein the conveyor is angularly oriented at an upward slope at an angle from 5 degrees to 10 degrees and includes a de-watering system configured to remove up to 95% of the dispensed fluid.

Embodiment 14

The system of Embodiment 1-13, wherein the chip routing line comprises a first valve and a second valve.

Embodiment 15

The system of Embodiment 1-14, further comprising a purge line fluidly coupled to the chip routing line at a location between the first valve and the second valve.

Embodiment 16

The system of Embodiment 1-15, further comprising a dryer configured to receive the plurality of polysilicon chips from the conveyor, wherein the dryer comprises a temperature sensor and a moisture sensor.

Embodiment 17

The system of Embodiment 1-16, wherein the dryer dispenses the plurality of chips to a packaging unit upon detection of a temperature detected from 115 degrees Fahrenheit to 220 degrees Fahrenheit by the temperature sensor and a humidity level detected from 5% to 25% by the moisture sensor as predetermined by the process.

Embodiment 18

A method of reclaiming polysilicon chips from a polysilicon cleaning apparatus is provided. The method includes flushing a plurality of polysilicon chips from a polysilicon cleaning apparatus through at least one polysilicon apparatus drain line, wherein each of the plurality of polysilicon chips has a longest dimensional length ranging from 0.1 mm to 25.0 mm. The method also includes routing the plurality of polysilicon chips through the polysilicon apparatus drain line to a main chip drain line that is oriented at a downward slope. The method further includes driving the plurality of polysilicon chips through the main chip drain line with a fluid to a chip collection tank Embodiment 19

The method of Embodiment 18, further comprising routing the plurality of polysilicon chips to a conveyor disposed at an upward angle relative to a direction of travel of the plurality of polysilicon chips and routing the plurality of polysilicon chips from the conveyor to a dryer.

Embodiment 20

The method of Embodiment 18-19, wherein the dryer is an automated dryer unit having a temperature sensor and a moisture sensor, the method further comprising monitoring a temperature within the automated dryer unit and a humidity level within the automated dryer unit; tumbling of the polysilicon chips within the automated dryer unit for increased drying; and dispensing the plurality of polysilicon chips to a packaging unit upon detection of a predetermined temperature detected by the temperature sensor and a predetermined humidity level detected by the moisture sensor.

The singular forms "a," "an," and "the" include plural referents unless the context clearly dictates otherwise. "Or" means "and/or." The modifier "about" used in connection with a quantity is inclusive of the stated value and has the meaning dictated by the context (e.g., includes the degree of error associated with measurement of the particular quantity). The notation "±10%" means that the indicated measurement can be from an amount that is minus 10% to an amount that is plus 10% of the stated value. The endpoints of all ranges directed to the same component or property are inclusive and independently combinable (e.g., ranges of "less than or equal to 25 wt %, or 5 wt % to 20 wt %," is inclusive of the endpoints and all intermediate values of the ranges of "5 wt % to 25 wt %," etc.). Disclosure of a narrower range or more specific group in addition to a broader range is not a disclaimer of the broader range or larger group.

The suffix "(s)" is intended to include both the singular and the plural of the term that it modifies, thereby including at least one of that term (e.g., the colorant(s) includes at least one colorants). "Optional" or "optionally" means that the subsequently described event or circumstance can or cannot occur, and that the description includes instances where the event occurs and instances where it does not. Unless defined otherwise, technical and scientific terms used herein have the same meaning as is commonly understood by one of skill in the art to which this invention belongs. A "combination" is inclusive of blends, mixtures, alloys, reaction products, and the like.

All cited patents, patent applications, and other references are incorporated herein by reference in their entirety. However, if a term in the present application contradicts or conflicts with a term in the incorporated reference, the term from the present application takes precedence over the conflicting term from the incorporated reference.

While typical embodiments have been set forth for the purpose of illustration, the foregoing descriptions should not be deemed to be a limitation on the scope herein. Accordingly, various modifications, adaptations, and alternatives can occur to one skilled in the art without departing from the spirit and scope herein.

What is claimed is:

1. A polysilicon chip reclamation assembly comprising:
   a polysilicon cleaning apparatus configured to clean a plurality of bodies of polysilicon;
   a plurality of polysilicon chips generated from the bodies of polysilicon during cleaning thereof, wherein each of the plurality of polysilicon chips has a longest dimensional length ranging from 0.1 mm to 25.0 mm;
   a polysilicon apparatus drain line configured to route the plurality of polysilicon chips from the polysilicon cleaning apparatus to a main chip drain line, wherein the main chip drain line is oriented at a downward slope away from the polysilicon apparatus drain line;
   a fluid source fluidly coupled to the main chip drain line and configured to inject a fluid into the main chip drain line to drive the plurality of polysilicon chips through the main chip drain line;
   a chip collection tank, wherein the main chip drain line comprises an outlet proximate the chip collection tank, the outlet configured to direct the plurality of polysilicon chips into the chip collection tank; and
   a chip routing line extending between an outlet of the chip collection tank and a conveyor.

2. The polysilicon chip reclamation assembly of claim 1, wherein the fluid comprises deionized water.

3. The polysilicon chip reclamation assembly of claim 1, wherein the downward slope of the main chip drain line is from 0.5 inches/foot to 1.5 inches/foot.

4. The polysilicon chip reclamation assembly of claim 1, wherein the main chip drain line comprises a plastic tube.

5. The polysilicon chip reclamation assembly of claim 4, wherein the plastic tube comprises a diameter of from 3 inches to 8 inches.

6. The polysilicon chip reclamation assembly of claim 1, wherein the chip collection tank comprises a rinsing system configured to dispense a rinsing fluid into contact with the plurality of polysilicon chips to neutralize a pH level of the plurality of chips.

7. The polysilicon chip reclamation assembly of claim 6, wherein the chip collection tank comprises an evacuation drain line configured to route the rinsing fluid out of the chip collection tank.

8. The polysilicon chip reclamation assembly of claim 1, wherein the conveyor comprises a vibratory conveyor.

9. The polysilicon chip reclamation assembly of claim 1, wherein the conveyor is angularly oriented at an upward slope at an angle from 5 degrees to 10 degrees and includes a de-watering system configured to remove up to 95% of the fluid injected by the fluid source that is present on the plurality of chips.

10. The polysilicon chip reclamation assembly of claim 1, wherein the chip routing line comprises a plurality of valves, the polysilicon chip reclamation assembly further comprising a purge line fluidly coupled to the chip routing line at a location between two of the plurality of valves.

11. The polysilicon chip reclamation assembly of claim 1, further comprising a dryer configured to receive the plurality of polysilicon chips from the conveyor, wherein the dryer comprises a temperature sensor and a moisture sensor.

12. A polysilicon chip reclamation assembly comprising:
a polysilicon cleaning apparatus configured to clean a plurality of bodies of polysilicon;
a plurality of polysilicon chips generated from the bodies of polysilicon during cleaning thereof;
a polysilicon apparatus drain line configured to route the plurality of polysilicon chips from the polysilicon cleaning apparatus to a main chip drain line, wherein the main chip drain line is oriented at a downward slope away from the polysilicon apparatus drain line;
a fluid source fluidly coupled to the main chip drain line and configured to inject a fluid into the main chip drain line to drive the plurality of polysilicon chips through the main chip drain line; and
a chip collection tank, the main chip drain line comprising an outlet proximate the chip collection tank, the outlet configured to direct the plurality of polysilicon chips into the chip collection tank, the chip collection tank comprising:
a rinsing system dispensing a rinsing fluid into contact with the plurality of polysilicon chips to neutralize a pH level of the plurality of chips; and
an evacuation drain line configured to route the rinsing fluid out of the chip collection tank;
a chip routing line extending between an outlet of the chip collection tank and a conveyor; and
a dryer configured to receive the plurality of polysilicon chips from the conveyor, wherein the dryer comprises a temperature sensor and a moisture sensor.

13. The polysilicon chip reclamation assembly of claim 12, wherein the conveyor is angularly oriented at an upward slope at an angle from 5 degrees to 10 degrees and includes a de-watering system configured to remove up to 95% of the fluid injected by the fluid source and the rinsing fluid that is present on the plurality of chips.

14. The polysilicon chip reclamation assembly of claim 12, wherein each of the plurality of polysilicon chips has a longest dimensional length ranging from 0.1 mm to 25.0 mm.

* * * * *